United States Patent
Lee

(10) Patent No.: US 7,357,708 B2
(45) Date of Patent: Apr. 15, 2008

(54) ANCHOR STRUCTURE FOR FANS

(75) Inventor: Tzung-Han Lee, Taipei Hsien (TW)

(73) Assignee: Zippy Technology Corp., Hsin-Tien, Taipei Hsien (TW)

( * ) Notice: Subject to any disclaimer, the term of this patent is extended or adjusted under 35 U.S.C. 154(b) by 208 days.

(21) Appl. No.: 10/665,500

(22) Filed: Sep. 22, 2003

(65) Prior Publication Data

US 2005/0064810 A1    Mar. 24, 2005

(51) Int. Cl.
*H05K 5/00*    (2006.01)

(52) U.S. Cl. .................... 454/184; 361/695; 415/213.1

(58) Field of Classification Search ................ 454/184; 361/695, 697; 415/213.1
See application file for complete search history.

(56) References Cited

U.S. PATENT DOCUMENTS

| | | | | |
|---|---|---|---|---|
| 4,549,322 A | * | 10/1985 | de Boeve et al. | 5/93.2 |
| 4,899,254 A | * | 2/1990 | Ferchau et al. | 361/695 |
| 5,208,730 A | * | 5/1993 | Tracy | 361/687 |
| 5,713,790 A | * | 2/1998 | Lin | 454/184 |
| 5,788,566 A | * | 8/1998 | McAnally et al. | 454/184 |
| 6,074,296 A | * | 6/2000 | Wu | 454/184 |
| 6,208,520 B1 | * | 3/2001 | Schmitt | 361/725 |
| 6,236,564 B1 | * | 5/2001 | Fan | 361/695 |
| 6,246,580 B1 | * | 6/2001 | Weng | 361/695 |
| 6,304,443 B1 | * | 10/2001 | Chou | 361/695 |
| 6,351,380 B1 | * | 2/2002 | Curlee et al. | 361/695 |
| 6,515,858 B2 | * | 2/2003 | Rodriguez et al. | 361/695 |
| 6,611,427 B1 | * | 8/2003 | Liao | 361/695 |

FOREIGN PATENT DOCUMENTS

| | | | |
|---|---|---|---|
| JP | 05152776 A | * | 6/1993 |
| JP | 10253088 A | * | 9/1998 |

* cited by examiner

*Primary Examiner*—Derek S. Boles
(74) *Attorney, Agent, or Firm*—Birch, Stewart, Kolasch & Birch, LLP

(57) ABSTRACT

An anchor structure for fans mainly to fasten a fan to an installation object without damaging the fan structure includes coupling members for fastening through holes formed on the corners of the fan. Each of the coupling members includes a first fastening element running through the through hole from the rear end thereof and a second fastening element running though the front end of the through hole to engage with the first fastening element so that the coupling members are fastened securely to maintain the fan structure in an integrated manner to perform normal operation.

10 Claims, 4 Drawing Sheets

ANCHOR STRUCTURE FOR FANS

FIELD OF THE INVENTION

The present invention relates to an anchor structure for fans and particularly to an anchor structure for safely fastening miniature or small fans without forming screw holes on the fans.

BACKGROUND OF THE INVENTION

Design of miniature or small fans has to take into account of the small size of the products. A frame of the fan, after deducting the operation space required for the vanes, does not have much spared space for fastening use. Thus conventional fastening structure usually adopts the one shown in FIG. 1 in which four through holes 21 are directly formed on the four corners of the frame of the fan 20. If the installation object 10 is a power supply, the power supply has a face panel 11 which has four corresponding apertures 111. Then screws 50 are fastened by force to generate a destructive inner wall in the through holes 21 to form a fastening condition. Such an approach damages the structure of the fan 20 and affects its normal operation, notably:

1. As the fan 20 is made from plastics and formed with a thin wall due to miniaturization consideration, the forced fastening of the metal screws 50 requires the screws 50 with a larger diameter than the through holes 21. Hence the through holes 21 are slightly deformed after the screws 50 have been fastened. Due to the screws 50 are fastened to the corners with a varying depth, the stresses and deformations occurred to the fan structure also are different. As a result, the distances between the fan spindle and various corners also are different. Hence when the fan 20 rotates, air pressures at various corners also are different. This causes decreasing of heat dissipation performance. If the variation is too large, the fan 20 could generate centrifugal rotation and eccentric vibration. Asides from wearing the spindle and generating vibration, abnormal noise occurs and malfunction could happen.

2. After the fan 20 has been operated for a period of time, the vanes tend to gather dusts that must be cleared to avoid affecting operation. Then the screws 50 must be unfastened from the through holes 21. This could cause breaking of the screw or enlarging of the through holes 21. Anchoring and fastening in the succeeding re-assembly become difficult.

SUMMARY OF THE INVENTION

In view of the aforesaid disadvantages, the primary object of the invention is to provide an anchor structure for fans that enables a fan to be fastened to an installation object without damaging the fan structure. According to the invention, the fan has through holes on the corners to couple with coupling members for anchoring purpose. Each of the coupling members includes a first fastening element running through the rear end of the through hole and a second fastening element running through the through hole to engage with the first fastening element. The coupling members thus may be fastened securely for anchoring thereby the integrity of the fan structure may be maintained to achieve normal operation.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The present invention will become more fully understood from the detailed description given hereinbelow and the accompanying drawings which are given by way of illustration only, and thus are not limitative of the present invention, and wherein:

DETAILED DESCRIPTION OF THE PREFERRED EMBODIMENTS

Figure 1:
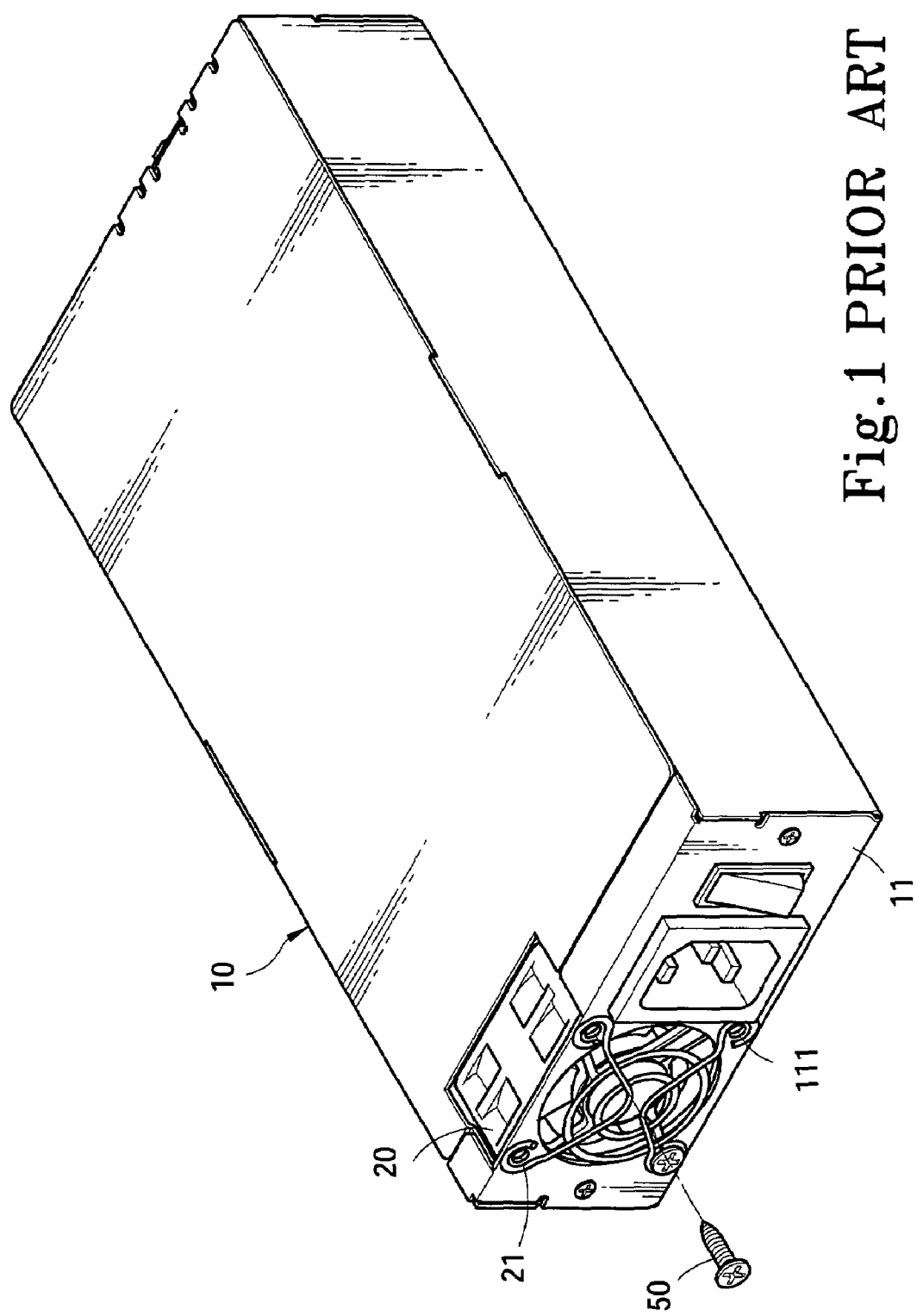
FIG. 1 is a schematic view of the anchor structure of a conventional fan.
Figure 2:
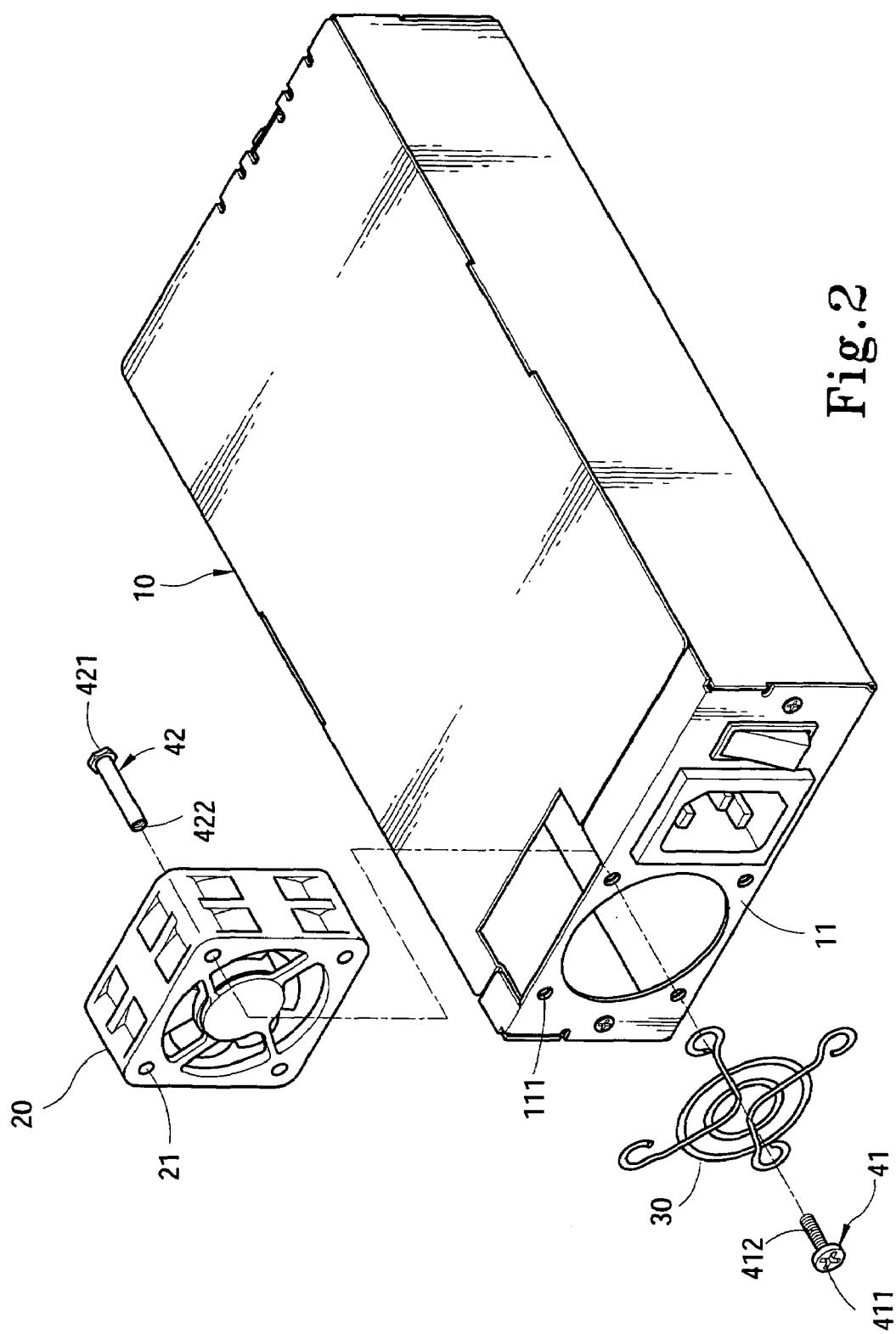
FIG. 2 is an exploded view of a first embodiment of the present invention
Figure 3:
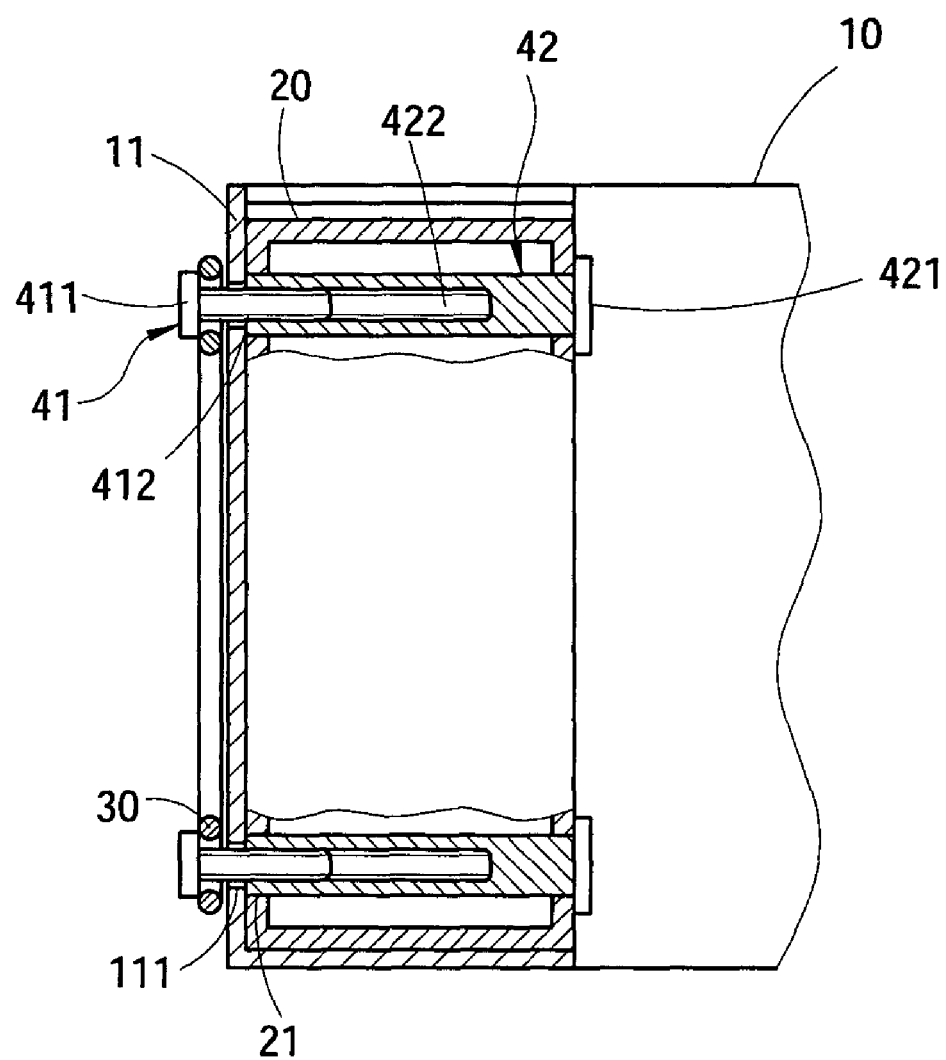
FIG. 3 is a schematic view of the first embodiment of the present invention assembled.

Please refer to FIGS. 2 and 3 for a first embodiment of the, invention. The invention aims at anchoring a fan 20 on an installation object 10 without damaging the structure of the fan 20. On the corners of the fan 20, through holes 21 are formed to engage with coupling members. Each of the coupling members includes a first fastening element 42 running through one through hole 21 from the rear end thereof, and a second fastening element 41 running through the front end of the through hole 21 to engage with the first fastening element 42. The first fastening element 42 has a tube diameter smaller than the diameter of the through hole 21 so that the first fastening element 42 may be movably inserted into the through hole 21 without expanding the diameter of the through hole 21, and be removed easily if desired. The second fastening element 41 has a tube diameter smaller than the tube diameter of the first fastening element 42. Moreover, the inner surface of the first fastening element 42 and the outer surface of the second fastening element 41 have respectively a screw section 422 and 412 corresponding to each other.

Taken an example that uses a power supply as the installation object 10 of the invention, after the first fastening element 42 has run through the through hole 21 of the fan 20 from the rear end, the second fastening element 41 may be inserted into the through hole 21 through a guarding mesh 30 (for preventing external articles from entering the fan 20) and the power supply (installation object 10). The installation object 10 has a face panel 11 which has apertures 111 formed thereon corresponding to the corners of the fan 20. Hence the first fastening element 42 and second fastening element 41 may be engaged with each other in the through hole. They are preferably engaged through the screw sections 422 and 412. Other fastening method such as snap latch with tenon and mortise may also be adopted.

Referring to FIG. 3, after the first fastening element 42 and the second fastening element 41 are engaged by screwing, as the distal ends of the first fastening element 42 and the second fastening end 41 have respectively a retaining head 421 and 411 that are larger than the through hole 21, they can effectively prevent the fan 20 from moving after fastened to achieve anchoring effect. In addition, the first fastening element 42 runs through the through hole 21 without damaging or changing the through hole 21. Thus the fan 20 can maintain the required operation function and performance. For repairs and maintenance of the fan 20, the fan 20 may be disassembled easily by using a simple hand tool such as a screw driver. Replacement and re-installation also is simple.

Figure 4:
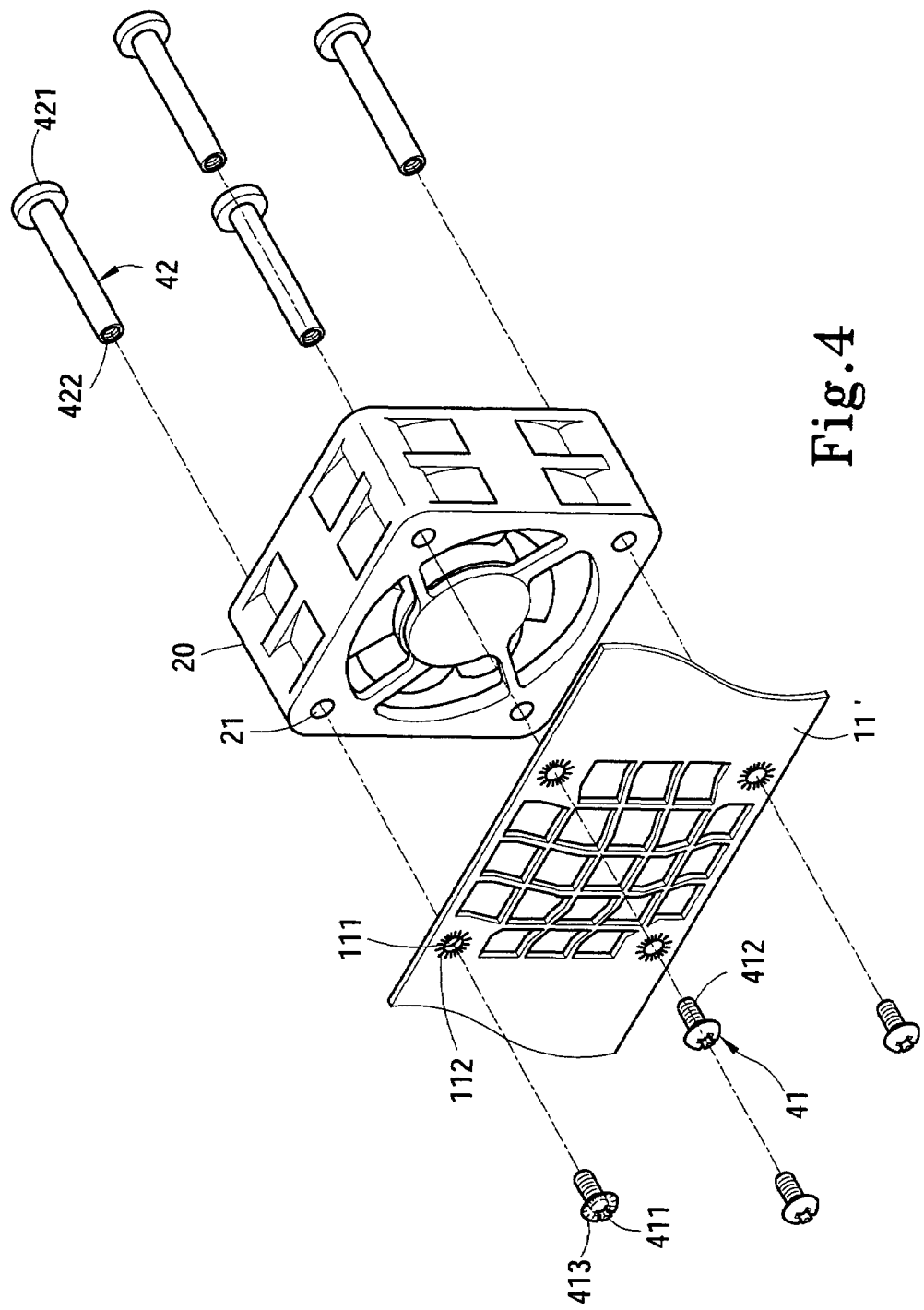
FIG. 4 is a schematic view of a second embodiment of the present invention for assembly.

Refer to FIG. 4 for a second embodiment of the invention. In this embodiment, the fan 20 is coupled directly on a face panel 11' which also serves as a guarding mesh with heat dissipation openings formed thereon. In addition, the corresponding locations of the retaining head 411 of the second fastening element 41 and the face panel 11' have respectively a retaining section 413 and 112 (formed in a radial manner, one is a bulged rim while the other is an indented recess). The face panel 11' has apertures 111 to enable the second fastening element 41 to engage with the first fastening element 42. The bottom side of the second fastening element 41 can compress the retaining sections 112 and 413 to form a latched relationship to reinforce the anchoring effect for the fan 20 without loosening or wobbling so that the function and performance of the fan 20 may be maintained as desired.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An anchor structure for fans to fasten a fan to an installation object without damaging the fan structure, comprising:
the fan having through holes formed on corners to engage with coupling members, each of the coupling members including a first fastening element running through the through hole from a rear end thereof and a second fastening element running though a front end of the through hole to engage with the first fastening element, a length of the second fastening element being less than a length of the through hole, an interior of the first fastening element and second fastening element have interconnecting threads for a rigid screw connection the second fastening element having a second retaining head, the second retaining head and the installation object each having a retaining section corresponding to each other.

2. The anchor structure for fans of claim 1, wherein the first fastening element has an inner wall surface and the second fastening element has an outer wall surface that form respectively a screw section of the screw connection, the screw section being shorter than a length of the first fastening element.

3. The anchor structure for fans of claim 1, wherein the first fastening element has a first retaining head.

4. The anchor structure for fans of claim 1, wherein the installation object is a power supply.

5. The anchor structure for fans of claim 1, wherein the first fastening element has a tube diameter smaller than the diameter of the through hole.

6. The anchor structure for fans of claim 5, wherein the second fastening element has a tube diameter smaller than that of the first fastening element.

7. The anchor structure for fans of claim 1, wherein the first fastening elements are detachably mounted in the anchor structure.

8. The anchor structure for fans of claim 1, wherein the first fastening element and second fastening element extend in a direction which is parallel to a rotational axis of the fan.

9. The anchor structure for fans of claim 1, wherein the first fastening element has a cap on one end which completely covers the end of the first fastening element.

10. The anchor structure for fans of claim 1, wherein the first fastening element has one open end and one closed end.

* * * * *